(12) United States Patent
Choi et al.

(10) Patent No.: US 10,699,868 B2
(45) Date of Patent: Jun. 30, 2020

(54) DEVICE AND METHOD FOR GENERATING ORGANIC MOLECULAR CLUSTER ION BEAM

(71) Applicant: KOREA BASIC SCIENCE INSTITUTE, Daejeon (KR)

(72) Inventors: Chang Min Choi, Chungcheongbuk-do (KR); Myoung Choul Choi, Chungcheongbuk-do (KR); Sang Ju Lee, Gyeongsangnam-do (KR); Ji Young Baek, Chungcheongbuk-do (KR); Jeong Jin Kim, Gyeonggi-do (KR)

(73) Assignee: KOREA BASIC SCIENCE INSTITUTE (KR)

( * ) Notice: Subject to any disclaimer, the term of this patent is extended or adjusted under 35 U.S.C. 154(b) by 0 days.

(21) Appl. No.: 16/185,527

(22) Filed: Nov. 9, 2018

(65) Prior Publication Data
US 2019/0355542 A1 Nov. 21, 2019

(30) Foreign Application Priority Data
May 15, 2018 (KR) .................. 10-2018-0055452

(51) Int. Cl.
*H01J 37/08* (2006.01)
*G01N 29/44* (2006.01)
*H01J 37/244* (2006.01)

(52) U.S. Cl.
CPC ............ *H01J 37/08* (2013.01); *H01J 37/244* (2013.01); *G01N 29/44* (2013.01); *H01J 2237/0812* (2013.01); *H01J 2237/0815* (2013.01)

(58) Field of Classification Search
CPC .. H01J 37/08; H01J 37/244; H01J 2237/0812; H01J 2237/0815; G01N 29/44
(Continued)

(56) References Cited

U.S. PATENT DOCUMENTS

| 6,331,227 B1 * | 12/2001 | Dykstra | H01J 37/147 118/723 CB |
| 2006/0183248 A1 * | 8/2006 | Small | C11D 11/0047 438/1 |
| 2014/0315271 A1 * | 10/2014 | Khoury | A61L 27/06 435/173.8 |

FOREIGN PATENT DOCUMENTS

| JP | 3285068 B2 | 3/2002 |
| JP | 5388288 B2 | 10/2013 |

(Continued)

OTHER PUBLICATIONS

Winograd, "The Magic of Cluster SIMS," Analytical Chemistry, Apr. 1, 2005, pp. 143-149.

(Continued)

*Primary Examiner* — Nicole M Ippolito
(74) *Attorney, Agent, or Firm* — Dorsey & Whitney LLP

(57) ABSTRACT

Disclosed is a device for generating an organic molecular cluster ion beam, the device including a receiver configured to accommodate an organic material, a cluster generator configured to generate a cluster by supersonic expanding the organic material accommodated in the receiver at a high speed, a photo-ionizer configured to temporarily accommodate the cluster that is generated through the cluster generator, an ultraviolet (UV) light source configured to irradiate an UV pulse to the photo-ionizer to ionize the cluster, and entrance electrodes disposed at both sides of the photo-ionizer and configured to provide a potential difference to the photo-ionizer to generate a cluster ion beam.

14 Claims, 6 Drawing Sheets

(58) Field of Classification Search
USPC ............... 250/423 R, 424, 423 P, 423 F, 288
See application file for complete search history.

(56) References Cited

FOREIGN PATENT DOCUMENTS

| KR | 10-2004-0050111 A | 6/2004 |
|---|---|---|
| KR | 10-0484318 B1 | 4/2005 |
| KR | 10-0687419 B1 | 2/2007 |
| KR | 10-2008-0111444 A | 12/2008 |
| KR | 10-2011-0122675 A | 11/2011 |
| KR | 10-2015-0036562 A | 4/2015 |
| KR | 10-2016-0083801 A | 7/2016 |

OTHER PUBLICATIONS

Yamada, et al. "Surface processing by gas cluster ion beams at the atomic (molecular) level," Journal of Vacuum Science & Technology A, vol. 14, No. 3, May 1996, pp. 781-785.

Cumpson, et al. "Depth profiling organic/inorganic interfaces by argon gas cluster ion beams: sputter yield data for biomaterials, in-vitro diagnostic and implant applications." Surface and Interface Analysis, 45, 2013, pp. 1859-1868.

\* cited by examiner

DEVICE AND METHOD FOR GENERATING ORGANIC MOLECULAR CLUSTER ION BEAM

CROSS REFERENCE TO RELATED APPLICATIONS

This application claims the benefit of priority pursuant to 35 U.S.C. § 119(a) of Korean Patent Application No. 10-2018-0055452 filed on 15 May 2018 in the Korean Intellectual Property Office, which is hereby incorporated herein by reference in its entirety.

BACKGROUND

Technical Field

One or more example embodiments relate a device and a method for generating an organic molecular cluster ion beam, and a mass analyzer including the device.

Description of Related Art

Gas cluster ion beam (GCIB), which releases and ionizes thermal electrons, is a powerful technique for in-depth analysis of solid materials and compound imaging.

However, when analyzing a biological sample such as an organic material or a biometric sample, a thermoelectron having a relatively high energy may bomb an organic molecular cluster of a primary ion source, which is suitable for the bio sample analysis, and break a molecular link. Thus, a method of ionizing the thermoelectron may not be suitable for use in biological sample analysis.

Also, primary ion beams such as Ga, Bi, O2, Cs, Ar, Xe, SF6 or C60 are currently commercialized and widely used. Such primary ion beams may be difficult to satisfy appropriate conditions for analysis based on various kinds of organic materials and biological samples to be measured.

Accordingly, there is a desire for a method and a device for generating an ion beam suitable for analyzing a biological sample.

The related art has been possessed or acquired by the inventor(s) in the course of conceiving the present invention and is not necessarily an art publicly known before filing the present application.

The information included in this Background section of the specification, including any references cited herein and any description or discussion thereof, is included for technical reference purposes only and is not to be regarded subject matter by which the scope of the invention as defined in the claims is to be bound.

SUMMARY

An aspect provides a method and a device for generating an organic molecular cluster ion beam.

According to an aspect, there is provided a device for generating an organic molecular cluster ion beam, the device including a receiver configured to accommodate an organic material, a cluster generator configured to generate a cluster by supersonic expanding the organic material accommodated in the receiver at a high speed, a photo-ionizer configured to temporarily accommodate the cluster that is generated through the cluster generator, an ultraviolet (UV) light source configured to irradiate an UV pulse to the photo-ionizer to ionize the cluster, and entrance electrodes disposed at both sides of the photo-ionizer and configured to provide a potential difference to the photo-ionizer to generate a cluster ion beam.

The device may further include a mass gate located downstream of the entrance electrode based on a travelling direction of the cluster ion beam and configured to adjust a cluster size of the cluster ion beam.

The mass gate may be located on a travelling path of the cluster ion beam and configured to control whether to pass the cluster ion beam generated in the device based on a magnitude of applied potential.

The device may further include a controller configured to synchronize an irradiation time point of the UV pulse irradiated from the UV light source with an activation time point at which an activating potential allowing a pass of the cluster ion beam is applied to the mass gate, based on a cluster size of the cluster ion beam selected by a user.

The controller may be configured to control the activation time point and an activation time in which the activation potential is applied from the activation time point based on the cluster size of the cluster ion beam selected by the user.

According to another aspect, there is also provided a method of generating an organic molecular cluster ion beam, the method including generating a cluster by supersonic expanding an organic material accommodated in a receiver at a high speed and supersonic expanding the cluster, photoionizing the supersonic expanded cluster by irradiating a UV pulseto the cluster, and accelerating a cluster ion beam in one direction by generating a potential difference in the photoionized cluster in the one direction.

The method may further include adjusting a cluster size of the cluster ion beam passing through a mass gate installed in the one direction by selectively applying a potential to the mass gate.

The adjusting of the cluster size may include adjusting, based on an irradiation time point of the UV pulse, an activation time point at which an activating potential allowing a pass of the cluster ion beam is applied to the mass gate and an activation time in which the activation potential is applied so that the cluster size of the cluster ion beam is selected.

The method may further include setting the cluster size of the cluster ion beam by setting a timing for forming a plurality of potential differences in the photoionized cluster based on a cluster size of the cluster ion beam required by a user.

The setting of the cluster size may include receiving a cluster size of the cluster ion beam from the user and calculating a time required by a cluster having the received size to reach a mass gate that controls a pass of the cluster ion beam based on an irradiation time point of the UV pulse and setting an activation time point at which an activating potential allowing a pass of the cluster ion beam is applied to the mass gate.

The setting of the cluster size may further include setting an activation time in which the activation potential is applied from the activation time point by calculating a time required by a cluster having a size greater than the received cluster size to reach the mass gate based on the activation time point after the activation time point is set.

According to still another aspect, there is also provided an organic molecular cluster ion beam mass analyzer including the device for generating the organic molecular cluster ion beam, a sample plate configured to hold a sample hit by a cluster ion beam, and a detector configured to detect a secondary ion generated from a surface of the sample.

The sample may be a biological sample.

The organic molecular cluster ion beam mass analyzer may further include a mass analysis controller configured to measure a mass of the secondary ion based on flight time information of the secondary ion detected by the detector.

Additional aspects of example embodiments will be set forth in part in the description which follows and, in part, will be apparent from the description, or may be learned by practice of the disclosure.

BRIEF DESCRIPTION OF THE DRAWINGS

These and/or other aspects, features, and advantages of the invention will become apparent and more readily appreciated from the following description of example embodiments, taken in conjunction with the accompanying drawings.

DETAILED DESCRIPTION

Figure 1:
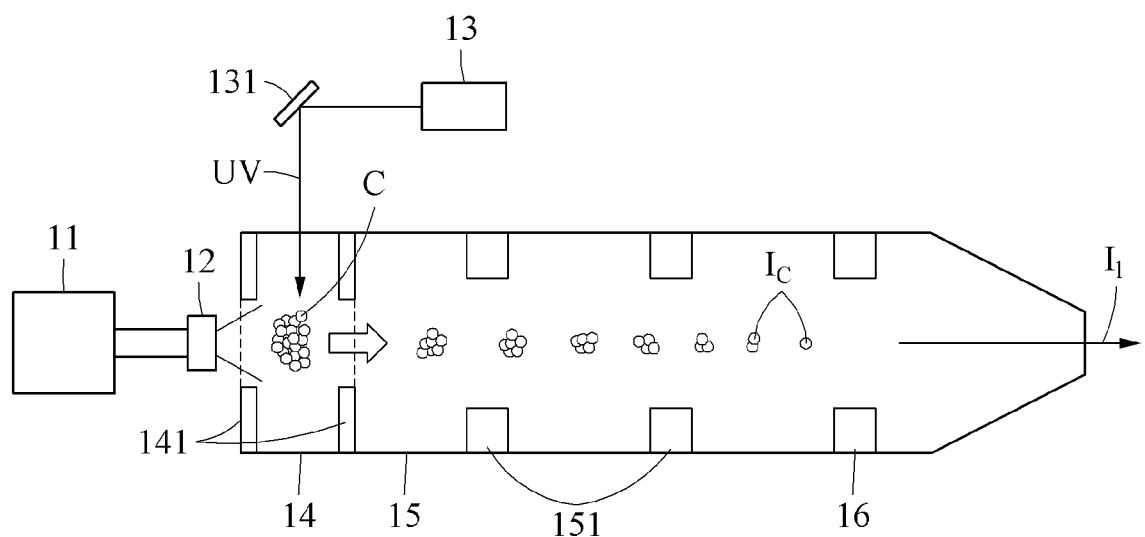
FIG. 1 is a diagram illustrating a device for generating an organic molecular cluster ion beam according to an example embodiment.

Hereinafter, example embodiments will be described in detail with reference to the accompanying drawings. Regarding the reference numerals assigned to the elements in the drawings, it should be noted that the same elements will be designated by the same reference numerals, wherever possible, even though they are shown in different drawings. Also, in the description of embodiments, detailed description of well-known related structures or functions will be omitted when it is deemed that such description will cause ambiguous interpretation of the present disclosure.

Terms such as first, second, A, B, (a), (b), and the like may be used herein to describe components. Each of these terminologies is not used to define an essence, order or sequence of a corresponding component but used merely to distinguish the corresponding component from other component(s). It should be noted that if it is described in the specification that one component is "connected," "coupled," or "joined" to another component, a third component may be "connected," "coupled," and "joined" between the first and second components, although the first component may be directly connected, coupled or joined to the second component.

A component described in any one of the example embodiments and a component including a common function or feature will be described using the same names in other example embodiments. Unless otherwise stated, the description in any one of the example embodiments may be applicable to other example embodiments, and a detailed description will be omitted in an overlapping range.

Figure 2:
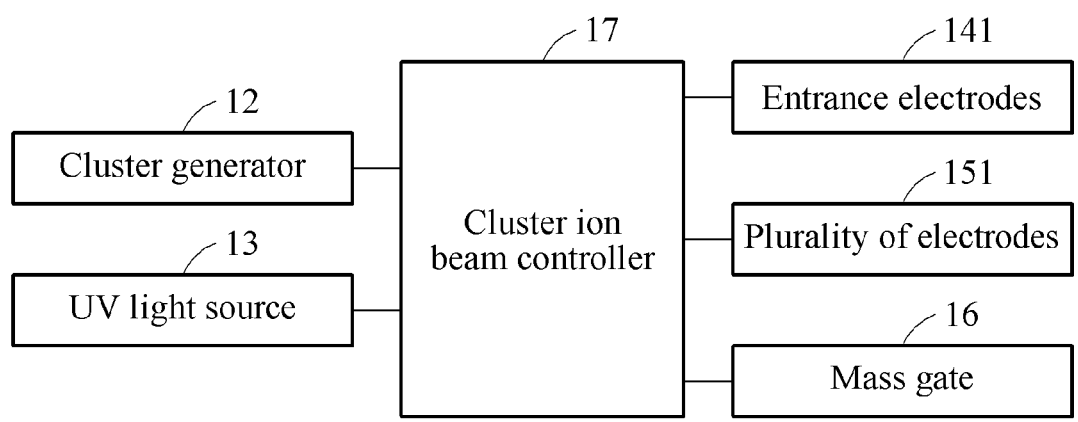
FIG. 2 is a block diagram illustrating a device for generating an organic molecular cluster ion beam according to an example embodiment.

FIG. 1 is a diagram illustrating a device for generating an organic molecular cluster ion beam according to an example embodiment and FIG. 2 is a block diagram illustrating a device for generating an organic molecular cluster ion beam according to an example embodiment.

Referring to FIGS. 1 and 2, a device 1 for generating an organic molecular cluster ion beam may be a device configured to generate an organic material suitable for biological sample analysis into a cluster and softly ionizing an organic molecular cluster generated through photoionization.

For example, in the device 1, all spaces through which an ion passes may be formed in vacuum.

The device 1 may include a receiver 11, a cluster generator 12, an ultraviolet (UV) light source 13, a photo-ionizer 14, an ion passage 15, a mass gate 16, and a cluster ion beam controller 17.

The receiver 11 may accommodate an organic material to form an organic molecular cluster C. An organic material suitable for biological sample analysis may be selected and accommodated in the receiver 11. For example, benzene, toluene, aniline, and phenol may be used as the organic material. The receiver 11 may be a container to accommodate a liquid organic material.

The cluster generator 12 may include a nozzle for high-speed supersonic expanding the organic material accommodated in the receiver 11 to the photo-ionizer 14 disposed nearby. For example, by the cluster generator 12, the organic material may be supersonically expanded and flow into the photo-ionizer 14 in a form of the organic molecular cluster C including a plurality of molecular clusters.

The UV light source 13 may be a light source that irradiates an UV pulse to the photo-ionizer 14. The UV pulse irradiated from the UV light source 13 may be irradiated to the organic molecular cluster C supersonic expanded to the photo-ionizer 14. The UV pulse irradiated from the UV light source 13 may be, for example, a UV-C light having a wavelength ranging between 100 and 280 nanometers (nm).

A mirror 131 may be disposed between the UV light source 13 and the photo-ionizer 14 to reflect the UV pulse output from the UV light source 13. An arrangement of the mirror 131 shown in FIG. 1 is merely an example, and a plurality or mirrors may be arranged depending on examples.

The photo-ionizer 14 may photo-ionize a plurality of organic molecular clusters C by using the UV pulse irradiated from the UV light source 13 to the organic molecular cluster C supersonic expanded from the cluster generator 12.

When the UV pulse is irradiated to the organic molecular cluster C formed in the photo-ionizer 14, molecules forming the organic molecular cluster C may absorb photons of the UV pulse and emit electrons based on an atomic photoelectric effect, thereby forming the plurality of organic molecular clusters C having a positive charge.

The photo-ionizer 14 may include entrance electrodes 141.

The entrance electrodes 141 may be disposed at both sides of the photo-ionizer 14 in one direction, for example, an emission direction to emit the organic molecular cluster C ionized in the photo-ionizer 14.

For example, when a potential difference is formed in the entrance electrodes 141 disposed at the both sides of the photo-ionizer 14, the plurality of ionized organic molecular clusters C may form a cluster ion beam I_C to be integrated and accelerated in the emission direction. In this example, the cluster ion beam I_C may pass through the ion passage 15 in the emission direction.

The ion passage 15 may provide a space through which the cluster ion beam I_C output from the photo-ionizer 14 in the emission direction passes.

The ion passage 15 may include a plurality of electrodes 151.

The plurality of electrodes 151 may include a plurality of electrodes arranged at preset intervals in the emission direction of the cluster ion beam I_C. For example, the plurality of electrodes 151 may increase a straightness of the cluster ion beam I_C by generating the potential difference in the emission direction of the cluster ion beam I_C. Also, the plurality of electrodes 151 may adjust the potential difference, thereby adjusting a speed and an acceleration of the cluster ion beam I_C to reach a desired level.

The mass gate 16 may be formed in one section of the ion passage 15 to adjust a cluster size of the cluster ion beam I_C. The mass gate 16 may be located downstream of the ion passage 15 based on the emission direction of the cluster ion beam I_C.

The mass gate 16 may include an electrode on which a potential is formed. The mass gate 16 may allow or disallow the cluster ion beam I_C to pass the mass gate 16 based on a size of an applied potential difference.

For example, a magnitude of potential difference that allows a pass of the cluster ion beam I_C may be referred to as an "activation potential" and a magnitude of potential difference that disallows a pass of the cluster ion beam I_C may be referred to as an "inactivation potential."

The mass gate 16 may adjust a point in time at which each of the activation potential and the inactivation potential is applied, and a time or an interval in which each of the activation potential and the inactivation potential is applied based on a point in time at which the UV pulse is irradiated from the UV light source 13, thereby allowing a pass of a photo-ionized organic molecular cluster C having a predetermined size and a predetermined mass in the cluster ion beam I_C emitted from the photo-ionizer 14.

Each of the plurality of organic molecular cluster C photo-ionized in the photo-ionizer 14 may have a different number of organic molecules therein. Thus, when the plurality of photo-ionized organic molecular clusters C is accelerated while passing through the ion passage 15, each of the organic molecular clusters C may pass the ion passage 15 at different speed and ordinal position based on the number of molecules therein.

For example, when the organic molecular cluster C has a relatively small number of molecules, a mass of the organic molecular cluster C may also be relatively small. In this example, the organic molecular cluster C may be rapidly accelerated to pass the photo-ionizer 14 in an earlier ordinal position. Conversely, when the organic molecular cluster C has a relatively large number of molecules, a mass of the organic molecular cluster C may also be relatively large. Thus, the organic molecular cluster C may pass the photo-ionizer 14 later than the other clusters C.

As such, the mass gate 16 may be installed in the photo-ionizer 14 through which the plurality of photo-ionized clusters C forming the cluster ion beam I_C passes and may allow the pass of the plurality of photo-ionized clusters C at a predetermined point in time for a predetermined period of time, thereby adjusting the number of molecules or the size of the photo-ionized cluster C passing through the mass gate 16.

For example, an integrated flow of ions formed while the photo-ionized cluster C selected by the mass gate 16 is passing the photo-ionizer 14 may be referred to as a primary ion beam I_1, and may also be referred to as the cluster ion beam I_C.

The cluster ion beam controller 17 may control an operation of the device 1. The cluster ion beam controller 17 may drive the cluster generator 12 to supersonic expand the organic material in the receiver 11 to the photo-ionizer 14 at a high speed.

The cluster ion beam controller 17 may drive the UV light source 13 to irradiate the UV pulse to the photo-ionizer 14, thereby performing a photoionization of the plurality of organic molecular clusters C supersonic expanded from the cluster generator 12.

The cluster ion beam controller 17 may measure a supersonic expanding time point of the organic molecular cluster C of the cluster generator 12 and an irradiation time point of the UV pulse of the UV light source 13. Also, the cluster ion beam controller 17 may synchronize the supersonic expanding time point and the irradiation time point based on a predetermined time interval such that a supersonic expanding of the organic molecular cluster C and an irradiation of the UV pulse are performed simultaneously.

The cluster ion beam controller 17 may generate the potential difference in the entrance electrodes 141 and accelerate the plurality of photo-ionized clusters C in one direction, thereby forming the cluster ion beam I_C.

The cluster ion beam controller 17 may adjust a speed and an acceleration of the cluster ion beam I_C, thereby adjusting a difference in potential applied to the entrance electrodes 141 and the plurality of electrodes 151.

The cluster ion beam controller 17 may selectively disallow the pass of the cluster ion beam I_C by selectively applying a potential of the mass gate 16.

The cluster ion beam controller 17 may adjust a point in time at which the activation potential or the inactivation potential is applied to the mass gate 16 based on the irradiation time point of the UV light source 13. Normally, the cluster ion beam controller 17 may apply the inactivation potential is applied to the mass gate 16. In contrast, the cluster ion beam controller 17 may apply the activation potential for a predetermined period of time to allow a pass of the organic molecular cluster C having a predetermined size and a predetermined mass.

For example, a time or an interval in which the cluster ion beam controller 17 applies the activation potential to the mass gate 16 from an activation time point may be referred to as an "activation time."

The cluster ion beam controller 17 may calculate the speed and the acceleration differently formed based on the size of the organic molecular cluster C forming the cluster ion beam I_C, using the potential difference formed by the entrance electrodes 141 and the plurality of electrodes 151.

The cluster ion beam controller 17 may adjust the activation time point and the activation time of the activation potential applied to the mass gate 16 based on the size of the organic molecular cluster C of the primary ion beam I_1 required by a user, thereby allowing a pass of the photo-ionized organic molecular cluster C corresponding to the required size.

The device 1 may use the organic material as a cluster source to output an ion beam, for example, the primary ion beam I_1 suitable for biological sample measurement.

The device 1 may adjust the size of the organic molecular cluster C of the output ion beam and thus, may provide an option to select the cluster ion beam I_C of an appropriate size for each biological sample to be measured.

Since the device 1 may generate a primary ion beam using a UV photon that is not affected by an electric field, a freedom of design may be assigned to the UV light source 13 so that the UV light source 13 is disposed to be free of an influence of a plurality of electrodes included in the device 1.

In comparison to a typical ion beam generating device that uses thermo-electrons emitted when heating a metal or a semiconductor, the device 1 may not require high-energy output equipment that is used to heat the metal or the semiconductor to a high temperature and thus, may generate the primary ion beam using a small amount of energy.

The device 1 may not require a separate electromagnetic element for aligning the irradiation direction of the UV pulse and thus, may be provided in a small size.

Figure 3:
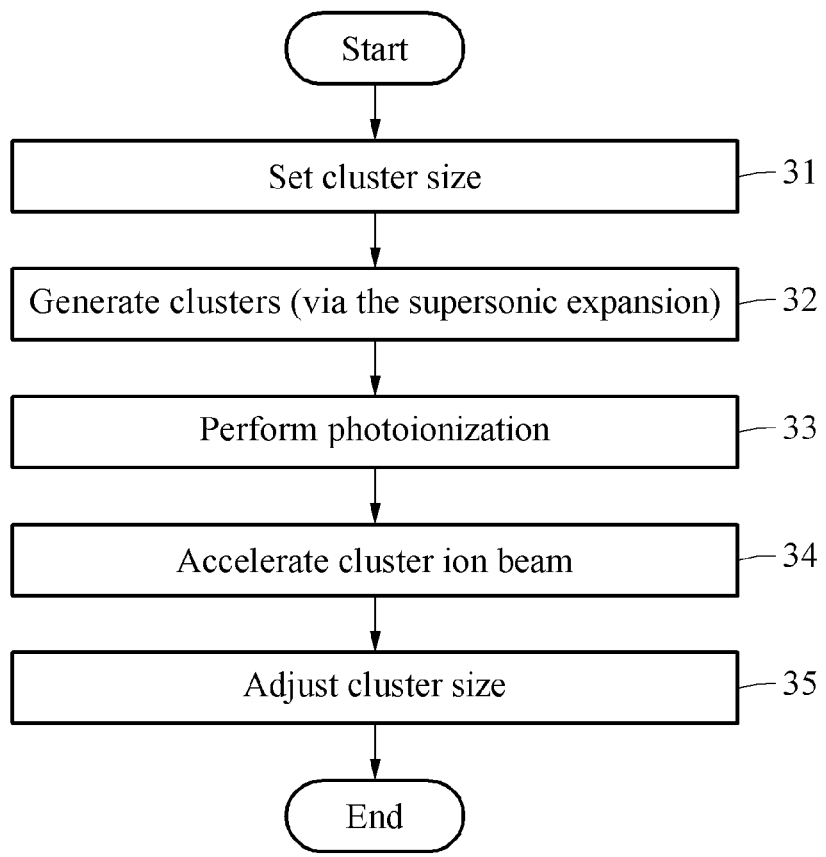
FIG. 3 is a flowchart illustrating a method of generating an organic molecular cluster ion beam according to an example embodiment.
Figure 4:
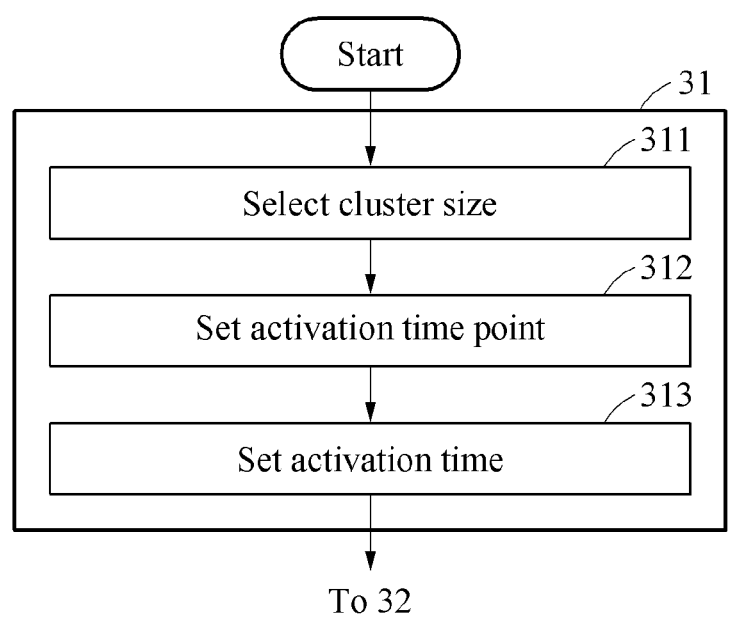
FIG. 4 is a flowchart illustrating an operation of setting a cluster size according to an example embodiment.

FIG. 3 is a flowchart illustrating a method of generating an organic molecular cluster ion beam according to an example embodiment and FIG. 4 is a flowchart illustrating an operation of setting a cluster size according to an example embodiment Referring to FIGS. 3 and 4, the method of generating an organic molecular cluster ion beam may be a method of generating a primary ion beam I_1 having a predetermined cluster size or an organic molecular cluster ion beam I_C based on an organic material using the device 1 as described with reference to FIGS. 1 and 2.

The method of generating an organic molecular ion beam may include operation 31 of setting a cluster size, operation 32 of supersonic expanding a cluster, operation 33 of performing a photoionization, operation 34 of accelerating a cluster ion beam 34, and operation 35 of adjusting a cluster size.

In operation 31, the cluster ion beam controller 17 may set a timing at which a plurality of potential differences is generated in the device 1 based on a desired size of the organic molecular cluster C of the primary ion beam I_1.

Operation 31 may include operation 311 of receiving a cluster size, operation 312 of setting an activation time point, and operation 313 of setting an activation time.

In operation 311, the cluster ion beam controller 17 may receive, as an input, a size of the organic molecular cluster C of the primary ion beam I_1 output through the device 1. For example, the size of the organic molecular cluster C input to the cluster ion beam controller 17 may be a numerical value obtained by setting a predetermined size interval as a unit.

In operation 312, the cluster ion beam controller 17 may calculate an activation time point at which the organic molecular cluster C having the received size reaches the mass gate 16 based on an irradiation time point of a UV pulse.

In operations 312 and 313, the cluster ion beam controller 17 may predict an effect of an electromagnetic force generated in the emission direction of the ion passage 15 based on potential differences to be generated in the entrance electrodes 141, the plurality of electrodes 151, and the mass gate 16.

Also, the cluster ion beam controller 17 may calculate a speed and an acceleration at which the photo-ionized organic molecular cluster C having the received size is formed in the ion passage 15, based on the received size of the organic molecular cluster C and a type of the organic material accommodated in the receiver 11.

The cluster ion beam controller 17 may calculate an activation time point at which the ionized organic molecular cluster C having the received size reaches the mass gate 16 based on an irradiation time point of a UV pulse.

In operation 313, the cluster ion beam controller 17 may calculate an activation time in which an organic molecular cluster having a size larger than the received size by one unit reaches the mass gate 16 based on the activation time point.

In operation 313, a difference between the activation time of the organic molecular cluster C having the received size and the activation time of the organic molecular cluster C having the size larger than the received size by one unit may be calculated.

When the size of the organic molecular cluster C of the cluster ion beam I_C is not to be adjusted in the device 1, operation 31 may be omitted.

In operation 32, the cluster ion beam controller 17 may drive the cluster generator 12 to generate a plurality of clusters C by supersonic expanding the organic material accommodated in the receiver 11 toward the photo-ionizer 14 at a high speed.

In operation 33, the cluster ion beam controller 17 may drive the UV light source 13, so that the UV pulse output from the UV light source 13 is irradiated to the plurality of clusters C supersonic expanded to the photo-ionizer 14 and a photoionization is performed.

In operation 34, the cluster ion beam controller 17 may accelerate the cluster ion beam I_C toward the ion passage 15 by forming a potential difference of the entrance electrodes 141 arranged at both sides of the photo-ionized cluster C.

For example, in operation 34, the cluster ion beam controller 17 may also adjust an acceleration of the photo-ionized clusters C by forming the potential difference of the plurality of electrodes 151 of the ion passage 15 based on an emission direction.

In operation 35, the cluster ion beam controller 17 may selectively apply an activation potential to the mass gate 16 based on the activation time and the activation time point set in operation 31, thereby adjusting a cluster size of a primary ion beam I_1 passing through the mass gate 16.

For example, in operation 35, the cluster ion beam controller 17 may synchronize the irradiation time point and the activation time point such that the activation potential is applied to the mass gate 16 at the activation time point set in operation 312, based on the irradiation time point at which the UV pulse is irradiated from the UV light source 13.

Normally, the cluster ion beam controller 17 may disallow a pass of the cluster ion beam I_C by applying an inactivation potential to the mass gate 16. After the organic molecular cluster C is supersonic expanded, the cluster ion beam controller 17 may apply the activation potential to the mass gate 16 only for the activation time at the activation time point from a point in time at which the UV pulse is irradiated to the cluster C.

For example, the activation time may be a short period of time. In this example, to form the activation potential in the mass gate 16, a signal of voltage applied by the cluster ion beam controller 17 to the mass gate 16 may be in a form of pulse.

By performing operation 35, the primary ion beam I_1 having a user's desired cluster size may be emitted to outside.

When the cluster ion beam I_C is emitted directly without adjusting the size of the organic molecular cluster C, operation 31 and operation 35 may not be performed.

Figure 5:
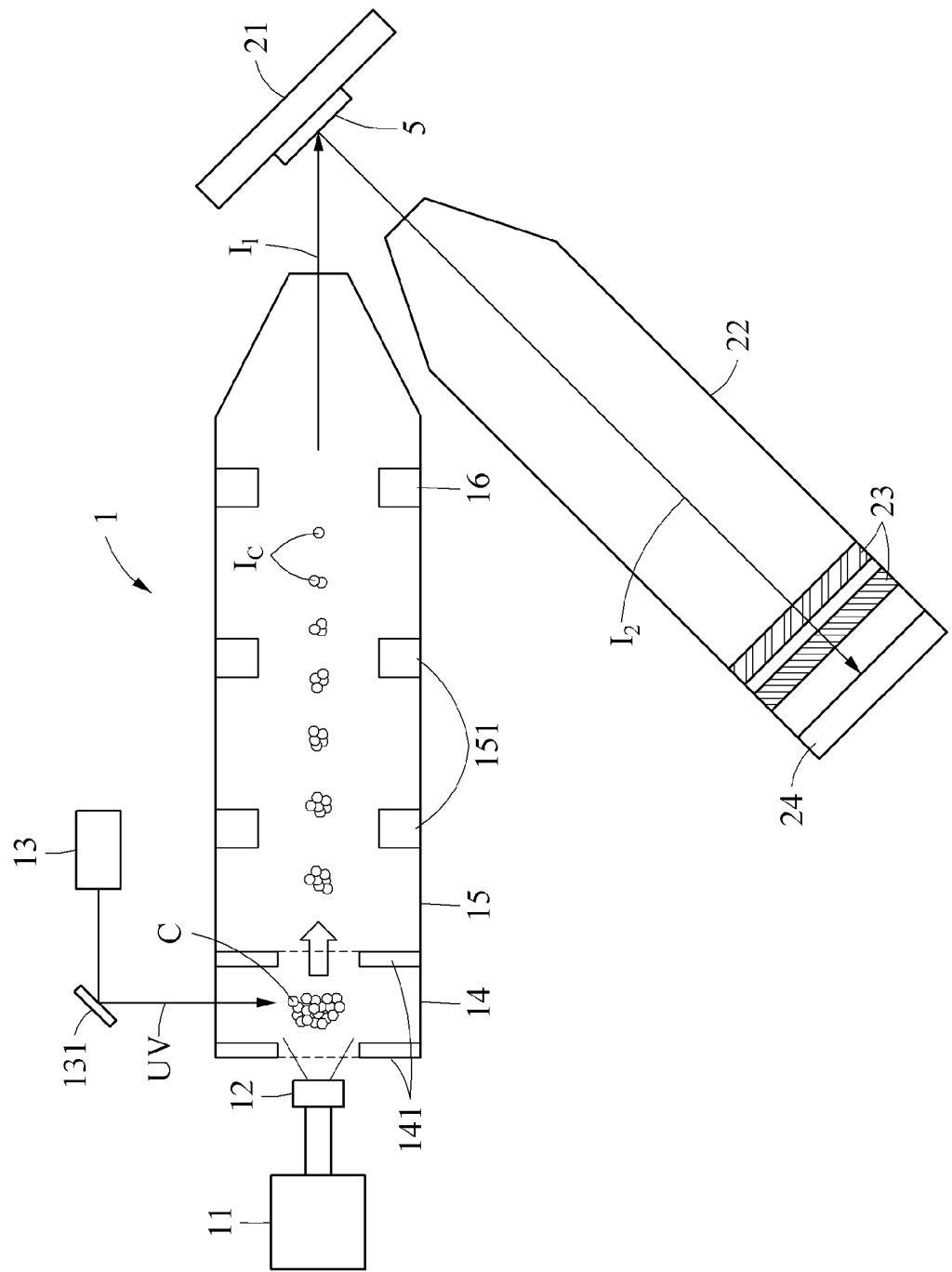
FIG. 5 is a diagram illustrating an organic molecular cluster ion beam mass analyzer according to an example embodiment.
Figure 6:
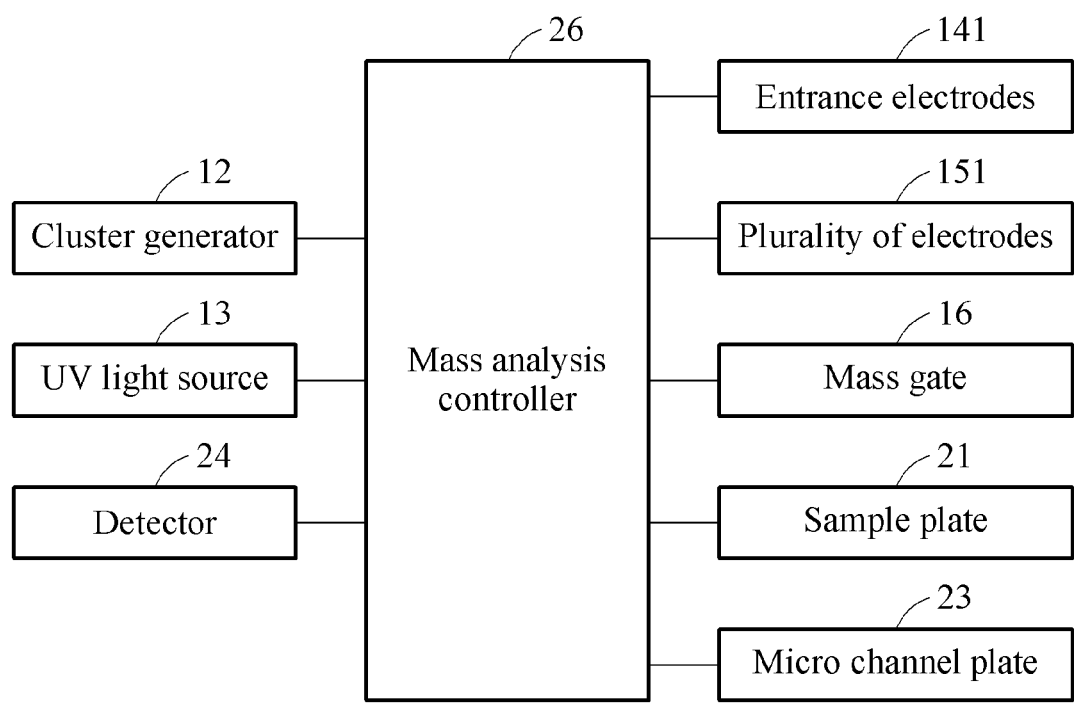
FIG. 6 is a block diagram illustrating an organic molecular cluster ion beam mass analyzer according to an example embodiment.

FIG. 5 is a diagram illustrating an organic molecular cluster ion beam mass analyzer according to an example embodiment and FIG. 6 is a block diagram illustrating an organic molecular cluster ion beam mass analyzer according to an example embodiment.

Referring to FIGS. 5 and 6, an organic molecular cluster ion beam mass analyzer 2 may be, for example, a time of flight (TOF) type secondary ion mass spectrometer (SIMS) that analyzes components of a sample 5 to be measured, through a measurement of a mass of a second ion I_2 output in response to an ion beam being emitted to the sample 5 using the device 1 of FIGS. 1 and 2 as a primary ion beam source.

The organic molecular cluster ion beam mass analyzer 2 may include the device 1, a sample plate 21, a secondary ion passage 22, a detector 24, and a mass analysis controller 26.

The device 1 may be the primary ion beam source that outputs an organic molecular cluster ion beam I_C emitted to the sample 5 disposed on the sample plate 21. The device 1 may include the configurations and features described with reference to FIGS. 1 and 2. For example, in the organic molecular cluster ion beam mass analyzer 2, all spaces through which ions pass may be formed in vacuum.

The sample 5 to be measured may be disposed on the sample plate 21. The sample 5 may be, for example, a biological sample.

The secondary ion passage 22 may be a space in which the secondary ion I_2 emitted from the sample 5 disposed on the sample plate 21 is accelerated toward the detector 24.

A micro channel plate 23 may be installed in the secondary ion passage 22 to amplify or induce the secondary ion I_2 such that the secondary ion I_2 incident on the secondary ion passage 22 is promoted toward the detector 24 rearwardly located in a travelling direction of the secondary ion I_2.

The detector 24 may be disposed in the secondary ion passage 22 to detect the secondary ion I_2 passing through the secondary ion passage 22.

The mass analysis controller 26 may analyze a characteristic of the sample 5 by analyzing a mass of the secondary ion I_2 based on a time difference of the secondary ion I_2 detected by the detector 24.

The mass analysis controller 26 may include, for example, the configurations and the controlling methods of the cluster ion beam controller 17. The mass analysis controller 26 may perform the control of the cluster ion beam controller 17 described in FIGS. 1 through 4 instead of the cluster ion beam controller 17. The cluster ion beam controller 17 and the mass analysis controller 26 may collectively be referred to as a "controller".

The organic molecular cluster ion beam mass analyzer 2 may effectively analyze a biological sample using an organic molecular cluster suitable for analyzing the biological sample as a primary ion source.

The organic molecular cluster ion beam mass analyzer 2 may appropriately adjust a cluster size of an organic molecular cluster ion beam based on a type of a biological sample to be measured, thereby selecting an organic molecular cluster ion beam suitable for analyzing the biological sample.

According to example embodiments, it is possible to provide a cluster ion beam generating device to perform ionization using an organic molecule suitable for analyzing a biological sample as a cluster source.

According to example embodiments, it is possible to provide a cluster ion beam generating device to selectively adjust a cluster size of an organic molecular cluster ion beam so as to be suitable for analyzing a biological sample.

A number of example embodiments have been described above. Nevertheless, it should be understood that various modifications may be made to these example embodiments. For example, suitable results may be achieved if the described techniques are performed in a different order and/or if components in a described system, architecture, device, or circuit are combined in a different manner and/or replaced or supplemented by other components or their equivalents. Accordingly, other implementations are within the scope of the following claims.

What is claimed is:

1. A device for generating an organic molecular cluster ion beam, the device comprising:
   a receiver configured to accommodate an organic material;
   a cluster generator including a nozzle configured to generate a cluster of molecules of the organic material by supersonic expanding the organic material accommodated in the receiver through the nozzle;
   a photo-ionizer configured to accommodate the cluster that is generated through the cluster generator;
   an ultraviolet (UV) light source configured to irradiate an UV pulse into the photo-ionizer to ionize the cluster; and
   entrance electrodes disposed at both sides of the photo-ionizer and configured to provide a potential difference for the photo-ionizer to generate a cluster ion beam.

2. The device of claim 1 further comprising a mass gate located downstream of the entrance electrode based on a travelling direction of the cluster ion beam and configured to adjust a cluster size of the cluster ion beam.

3. The device of claim 2, wherein the mass gate is located on a travelling path of the cluster ion beam and configured to control whether to pass the cluster ion beam generated in the device based on a magnitude of applied potential.

4. The device of claim 3 further comprising a controller configured to synchronize an irradiation time point of the UV pulse irradiated from the UV light source with an activation time point at which an activating potential allowing a pass of the cluster ion beam is applied to the mass gate, based on a cluster size of the cluster ion beam selected by a user.

5. The device of claim 4, wherein the controller is configured to control the activation time point and an activation time in which the activation potential is applied from the activation time point based on the cluster size of the cluster ion beam selected by the user.

6. A method of generating an organic molecular cluster ion beam, the method comprising:
   generating a cluster of molecules of an organic material by supersonically expanding the organic material through a nozzle;
   accommodating the cluster in a receiver;
   photoionizing the cluster in the receiver by irradiating an ultraviolet (UV) pulse to the cluster; and
   accelerating a cluster ion beam in one direction by applying a potential difference in the photoionized cluster in the one direction.

7. The method of claim 6 further comprising adjusting a cluster size of the cluster ion beam passing through a mass gate installed in the one direction by selectively applying a potential to the mass gate.

8. The method of claim 7, wherein the adjusting of the cluster size comprises adjusting, based on an irradiation time point of the UV pulse, an activation time point at which an activating potential allowing a pass of the cluster ion beam is applied to the mass gate and an activation time in which the activation potential is applied so that the cluster size of the cluster ion beam is selected.

9. The method of claim 6 further comprising setting the cluster size of the cluster ion beam by setting a timing for forming a plurality of potential differences in the photoionized cluster based on a cluster size of the cluster ion beam required by a user.

10. The method of claim 9, wherein the setting of the cluster size comprises
   selecting a cluster size of the cluster ion beam from the user; and
   calculating a time required by a cluster having the received size to reach a mass gate that controls a pass of the cluster ion beam based on an irradiation time point of the UV pulse and setting an activation time point at which an activating potential allowing a pass of the cluster ion beam is applied to the mass gate.

11. The method of claim 10, wherein the setting of the cluster size further comprises setting an activation time in which the activation potential is applied from the activation time point by calculating a time required by a cluster having a bigger size than the selected cluster size to reach the mass gate based on the activation time point after the activation time point is set.

12. An organic molecular cluster ion beam mass analyzer comprising:
   the device of claim 1;
   a sample plate configured to hold a sample bombarded by a cluster ion beam; and
   a detector configured to detect a secondary ion generated from a surface of the sample.

13. The organic molecular cluster ion beam mass analyzer of claim 12, wherein the sample is a biological sample.

14. The organic molecular cluster ion beam mass analyzer of claim 12 further comprising a mass analysis controller configured to measure a mass of the secondary ion based on flight time information of the secondary ion detected by the detector.

* * * * *